(12) United States Patent
Das et al.

(10) Patent No.: US 8,136,075 B1
(45) Date of Patent: Mar. 13, 2012

(54) MULTILEVEL SHARED DATABASE FOR ROUTING

(75) Inventors: Satyaki Das, Palo Alto, CA (US); Christopher H. Kingsley, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 665 days.

(21) Appl. No.: 12/267,058

(22) Filed: Nov. 7, 2008

(51) Int. Cl.
*G06F 17/50* (2006.01)
*G06F 9/455* (2006.01)

(52) U.S. Cl. ........ 716/126; 716/104; 716/116; 716/132; 716/135

(58) Field of Classification Search .......... 716/118–119, 716/121, 126, 128–130, 138, 137, 104, 116
See application file for complete search history.

(56) References Cited

U.S. PATENT DOCUMENTS

| | | | | |
|---|---|---|---|---|
| 3,621,208 A | * | 11/1971 | Donald et al. ................ | 716/126 |
| 6,385,758 B1 | * | 5/2002 | Kikuchi et al. ............... | 716/122 |
| 6,738,961 B2 | * | 5/2004 | Snider .......................... | 716/128 |
| 6,766,502 B1 | * | 7/2004 | Pyo et al. ..................... | 716/129 |
| 6,792,587 B2 | * | 9/2004 | Xing et al. .................... | 716/129 |
| 7,392,498 B1 | * | 6/2008 | Srinivasan et al. ............ | 716/103 |
| 7,788,623 B1 | * | 8/2010 | Endo et al. .................... | 716/128 |
| 7,890,913 B1 | * | 2/2011 | Kang et al. .................... | 716/100 |
| 2003/0163796 A1 | * | 8/2003 | Snider ............................ | 716/12 |
| 2006/0225020 A1 | * | 10/2006 | Chandrakasan et al. ........ | 716/17 |
| 2008/0288909 A1 | * | 11/2008 | Leijten-Nowak ............... | 716/16 |

OTHER PUBLICATIONS

Chin, Scott Y.L. et al., "Memory Footprint Reduction for FPGA Routing Algorithms," *Proc. of the 2007 International Conference on Field-Programmable Technology (ICFPT'07)*, Dec. 12-14, 2007, pp. 1-8, Kitayushu, Japan.

* cited by examiner

*Primary Examiner* — Stacy Whitmore
(74) *Attorney, Agent, or Firm* — W. Eric Webostad; Gerald Chan; Thomas George (57) ABSTRACT

A multilevel shared database for routing for an integrated circuit is described. An aspect relates generally to a database comprising routing edges defined by tile templates. The routing edges are associated with a plurality of wire length segmentations. The tile templates are associated with tiles of an integrated circuit. The tiles are repeated circuit blocks forming an array. A portion of the tile templates are shared among a portion of the tiles such that the tile templates are less in number than the tiles. The tile templates are associated with pointers for pointing to wire templates.

20 Claims, 8 Drawing Sheets

MULTILEVEL SHARED DATABASE FOR ROUTING

FIELD OF THE INVENTION

The invention relates to integrated circuit devices ("ICs"). More particularly, the invention relates to a multilevel shared database for routing for an IC.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Mapping, placing, and routing of a user's design to FPGA resources are well known. However, what may be less well known is that the router has access to a database representation of physical routing resources and programmable connections of an FPGA. Routing resources of an FPGA form what is known as a directed graph, and is sometimes referred to as a routing graph. In a routing graph, physical wires are nodes, and programmable connections, sometimes known as programmable interconnect points ("PIPs"), between such nodes are referred to as edges. A router operates using a routing graph, and assigns each network of the user design a set of PIPs. After routing, each sink wire or sink node may be reached from a source wire or source node of an associated circuit network ("net").

As FPGA chips increase in size, so do the number of wires associated with routing. A relatively large FPGA chip may have more than a million wires to be accounted for by a router. Accordingly, the amount of memory employed for storing a routing graph has increased with increasing FPGA sizes. Unfortunately, the amount of memory consumed by a routing graph may make a computer system used to implement a router more costly.

Accordingly, it would be desirable and useful to reduce the memory footprint associated with a routing graph.

SUMMARY OF THE INVENTION

One or more aspects generally relate to a multilevel shared database for routing for an integrated circuit.

An aspect relates generally to a database comprising routing edges defined by tile templates. The routing edges are associated with a plurality of wire length segmentations. The tile templates being associated with tiles of an integrated circuit. The tiles being repeated circuit blocks forming an array. A portion of the tile templates being shared among a portion of the tiles such that the tile templates are less in number than the tiles. The tile templates being associated with pointers for pointing to wire templates.

Another aspect relates generally to a method for providing routing information for an integrated circuit. A wire representation is obtained. The wire representation is decomposed into position information and wire information. A tile template is obtained responsive to the position information. The tile template is associated with a tile of the integrated circuit. The tile is a circuit block used in forming an array of circuit blocks of the integrated circuit. The tile template defines routing edges, which are with a plurality of wire length segmentations. A wire template is obtained responsive to the wire information. The wire template is associated with wires of the tile and having location information. The position information and the location information are used for determining a successor wire.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
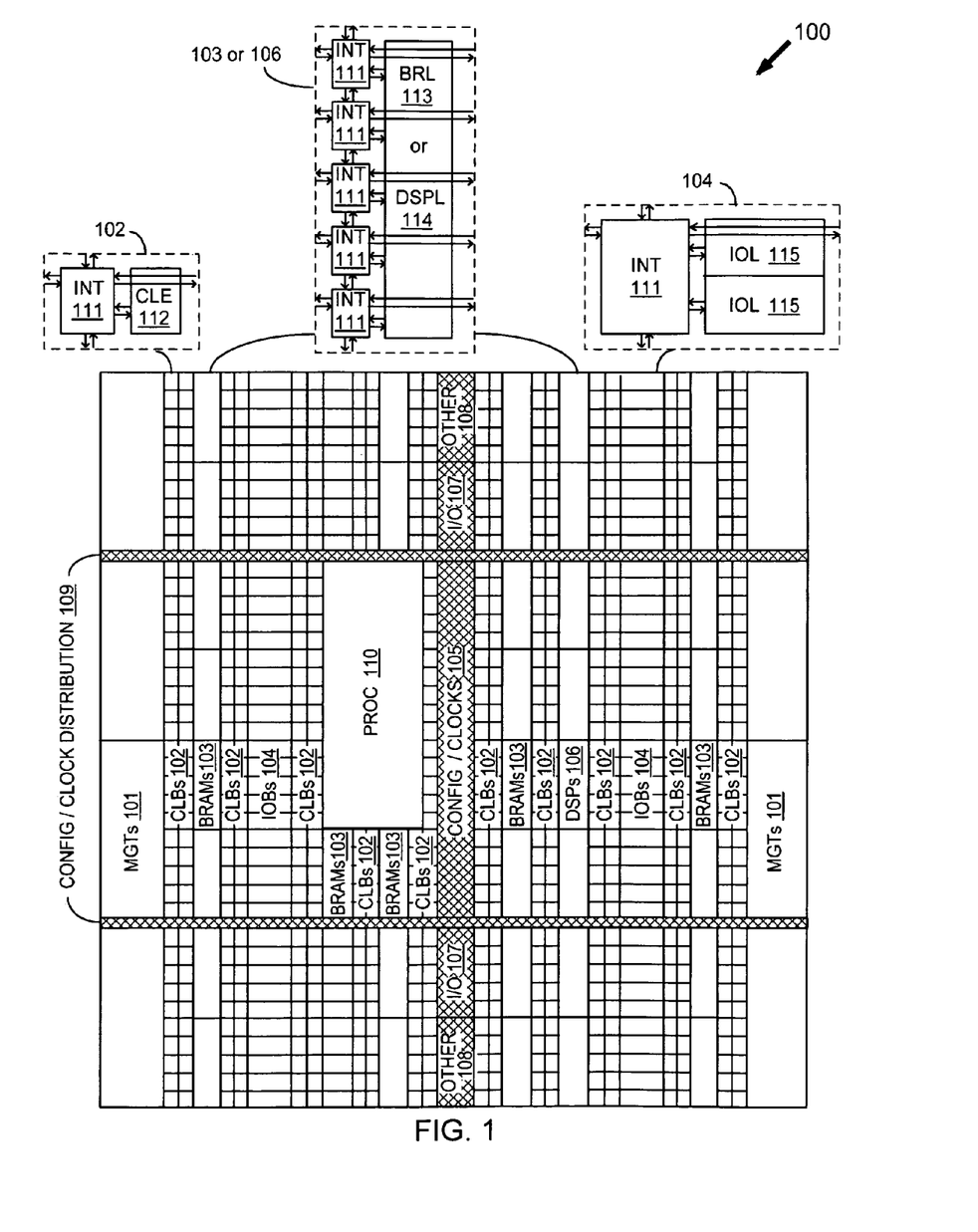
FIG. 1 is a simplified block diagram depicting an exemplary embodiment of a columnar Field Programmable Gate Array ("FPGA") architecture in which one or more aspects of the invention may be implemented.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a columnar area near the center of the die (shown in FIG. 1) is used for configuration, clock, and other control logic. Horizontal areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a column, the relative width of the columns, the number and order of columns, the types of logic blocks included in the columns, the relative sizes of the logic blocks, and the interconnect/logic implementations included at the top of FIG. 1 are purely exemplary. For example, in an actual FPGA more than one adjacent column of CLBs is typically included wherever the CLBs appear, to facilitate the efficient implementation of user logic, but the number of adjacent CLB columns varies with the overall size of the FPGA.

It should be appreciated than an FPGA architecture is relatively regular. There are limited numbers of tiles, such as CLBs, DSPs, IOBs, among others. An FPGA is generally floor mapped by putting tiles together in two dimensional arrays. As shall be appreciated from the following description, this regularity created by tiling may be used to compress a routing graph, as described below in additional detail.

Generally, a router finds successors of a wire ("successor wires"). In other words, given a wire w, a router finds a list of successor wires which wire w may connect to using a single PIP. As described below in additional detail, a database or data structure may be built for representing a routing graph which reduces memory footprint in comparison with prior routing graphs.

Figure 2:
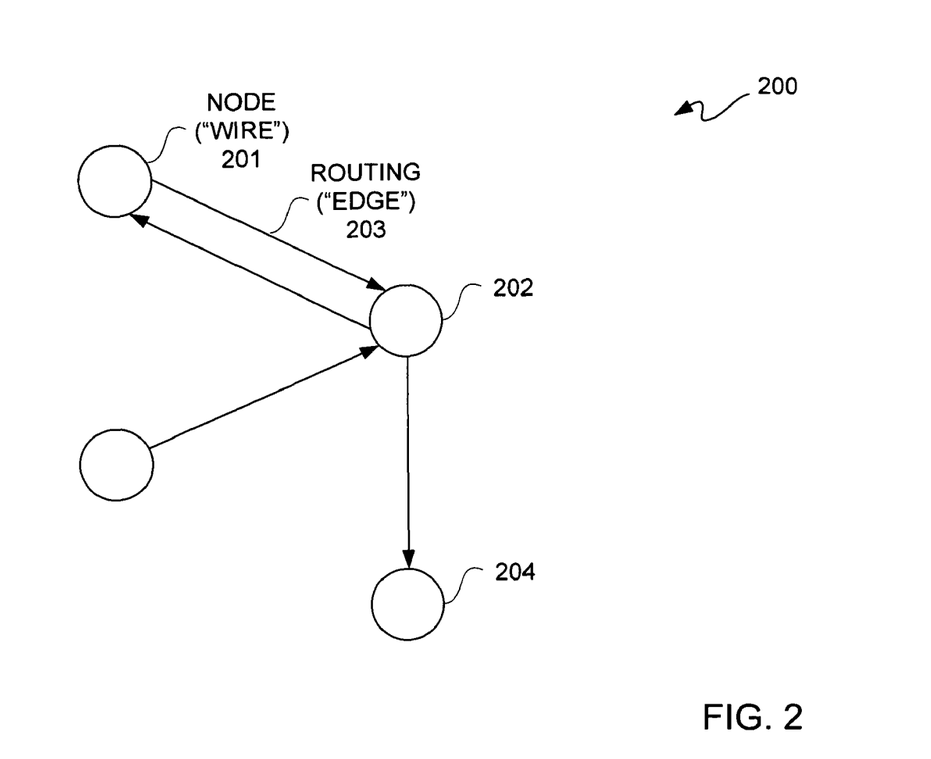
FIG. 2 is a nodal diagram depicting an exemplary embodiment of a network of nodes.

FIG. 2 is a nodal diagram depicting an exemplary embodiment of a network of nodes 200. Network of nodes 200 includes node 201 and node 202. Node 201 represents a wire, such as an output wire of a circuit block. Wire 201 is coupled to wire 202, which may be an input wire of another circuit block, by at least one PIP and associated wiring ("edge") 203. Edge 203 is unidirectional with respect to going from wire 201 to wire 202. However, it should be appreciated that another edge may be used for going from wire 202 to wire 201.

Edge 203 includes at least one PIP, where such PIP may be part of a switchbox, as described below in additional detail. Wire 202 may be a destination into another circuit block, or wire 202 may be for routing to another node, such as node 204 in this example.

Figure 3:
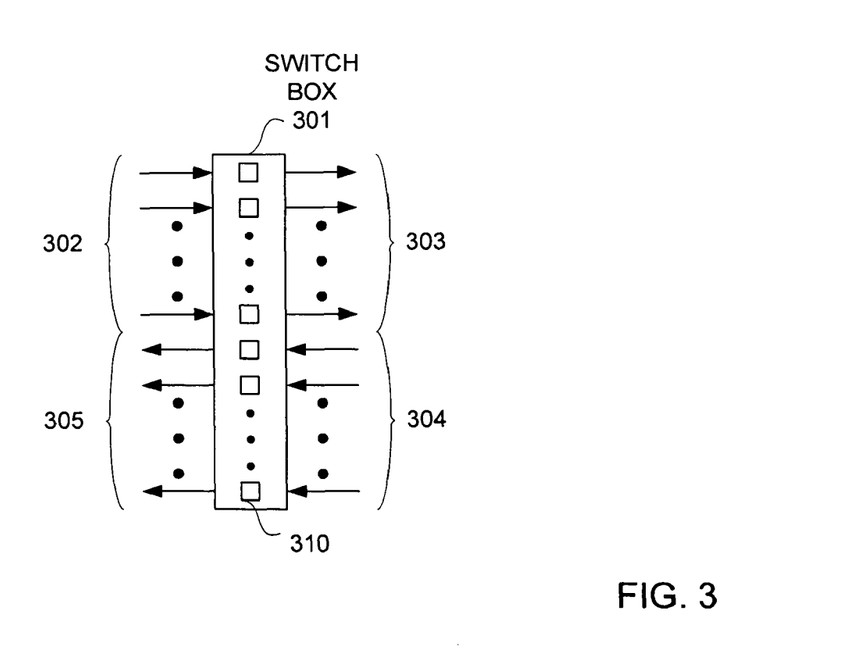
FIG. 3 is a block diagram depicting an exemplary embodiment of a switchbox.

FIG. 3 is a block diagram depicting an exemplary embodiment of a switchbox 301. Switchbox 301 includes a plurality of PIPs 310. Switchbox 301 may be part of a tile or located in near proximity to a tile for purposes of interconnecting with other tiles. Thus, input wires 302 to switchbox 301 may use associated PIPs 310 for cross-connecting to output wires 303. In this manner, source wires coupled to source circuits via input wires 302 may be coupled to sink wires via output wires 303. Likewise, switchbox 301 may receive source input via input wires 304 for output via output wires 305 connected by associated PIPs 310. Thus, each input wire 302 or 304 to switchbox 301 may have an associated PIP for coupling such input wire to an output wire. Switchbox 301 may thus function similarly to a cross-connect device. Not all incoming wires into a circuit block need to pass through switchbox 301; some incoming wires may go directly to circuitry of a circuit block. As switchbox 301 is well known, and as such it is not described in unnecessary detail herein.

Figure 4:
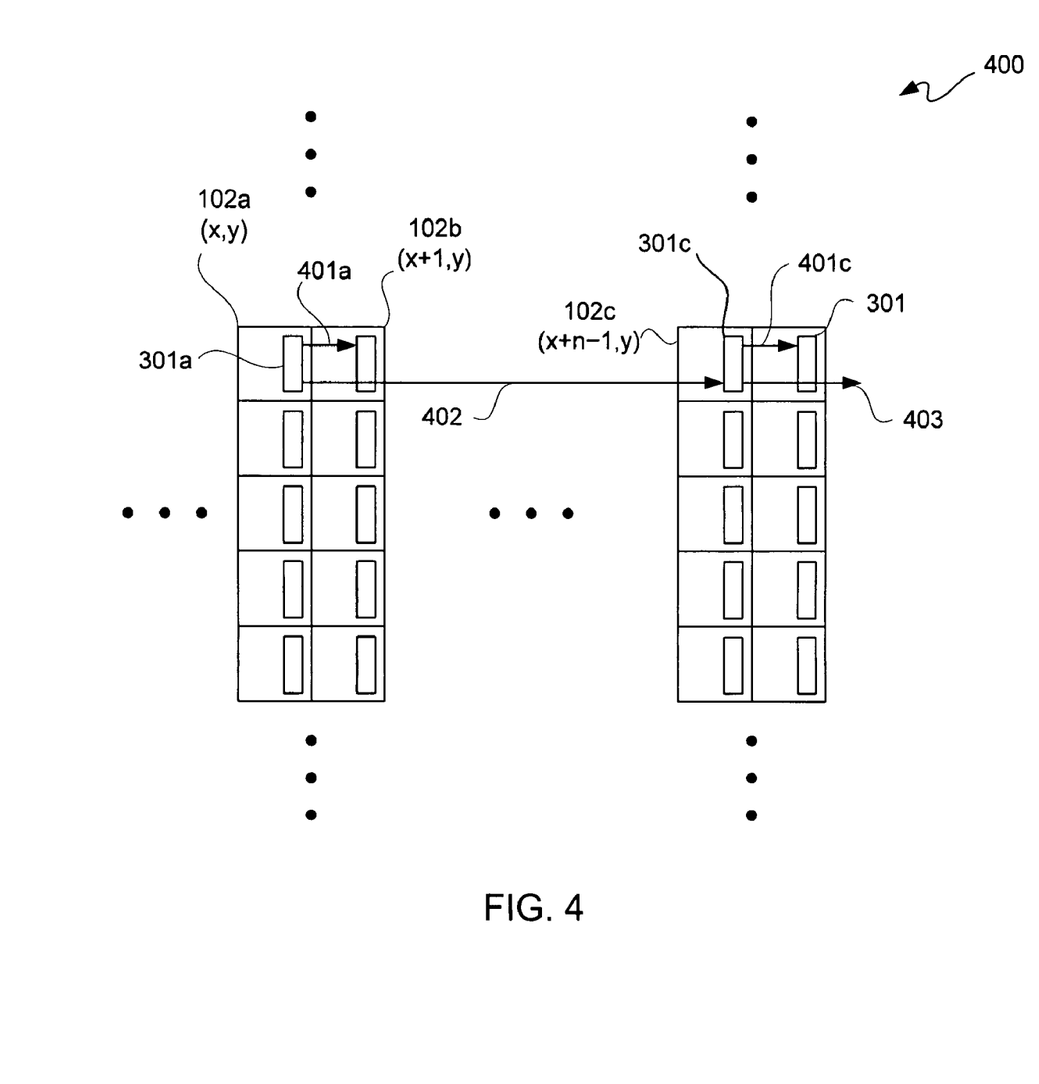
FIG. 4 is a block diagram depicting an exemplary embodiment of an array of tiles.

FIG. 4 is a block diagram depicting an exemplary embodiment of an array of tiles 400. In this exemplary embodiment, array of tiles 400 is an array of CLBs 102. For example, CLB 102a may have coordinates (x,y) for x and y representing a column address and a row address, respectively, and for n an integer number indicating distance from the edge of an array 400 in a columnar or horizontal direction. Thus for example, CLB 102b which is over one column to the right of CLB 102a may be coordinates at (x+1,y). Moving even closer to an edge of array 400 in the horizontal direction is CLB 102c. CLB 102c may have coordinates (x+n−1,y).

Each of CLBs 102a through 102c may include a switchbox 301. Emanating from such switchbox may be wires. For purposes of clarity by way of example, only one direction, namely the forward direction, is described, as the reverse direction will be understood from the following description. From switchbox 301a of CLB 102a, wires 401a and 402 may emanate. From switchbox 301c, wires 401c and 403 may emanate. Wire 401a may be of a different length than wire 402, and wire 401c may be of a different length than wire 403. Sometimes these lengths are referred to as segments. Furthermore, there may be different sets of segments available for routing to different tiles. For example, a one-tile wire or a wire of segmentation one, may be used for interconnecting to an immediately adjacent tile. A two-tile wire, or wire with segmentation two, is a two tile length wire, namely it has terminals in three tiles (a source tile, a tile immediately adjacent to the source tile in a direction of travel, and a tile that is one tile removed from a such an immediately adjacent tile in the direction of travel. In some instances, wires may spill over to an adjacent tile in a direction perpendicular to the direction of travel. For example, a horizontal wire of length two with source at (x,y) may have end points in tiles at (x+1,y), (x+2,y), and (x+2,y+1), as a consequence of laying out FPGAs with regularly placed tiles. In this particular example, only the horizontal direction of travel is shown; however, it should be appreciated that both vertical and horizontal directions of travel with respect to an array, namely up and down and right and left, may emanate from wires of a CLB. Thus, for purposes of clarity by way of example and not limitation, only one direction of travel is described, as other directions of travel will be apparent from the following description.

Another segmentation may be longer than a two-tile wire. If wire 402 were a six-tile wire, there would be five CLBs or five CLB tiles between CLB 102a and 102c in the horizontal direction, namely in row x. Of course, other values of segmentation than those used herein may be employed without departing from the scope of the following description. Additionally, it should be understood that CLB 102c is too close to the right edge of array 400 for having a six-tile wire 402 extend horizontally to the right and stay within array 400. Rather, a six-tile wire of CLB 102c, such as wire 403, may make a U-turn back into the array heading to the other (i.e., far left) side of array 400 or may terminate at the far right side of array 400. It should be understood that CLBs 102 are formed by tiling of same patterns, thus for example if CLB 102a has a six-tile wire, then so do CLBs 102b and 102c. However, the routing of such wires may be different in the sense that it is not repetitive due to position within array 400.

Figure 5:
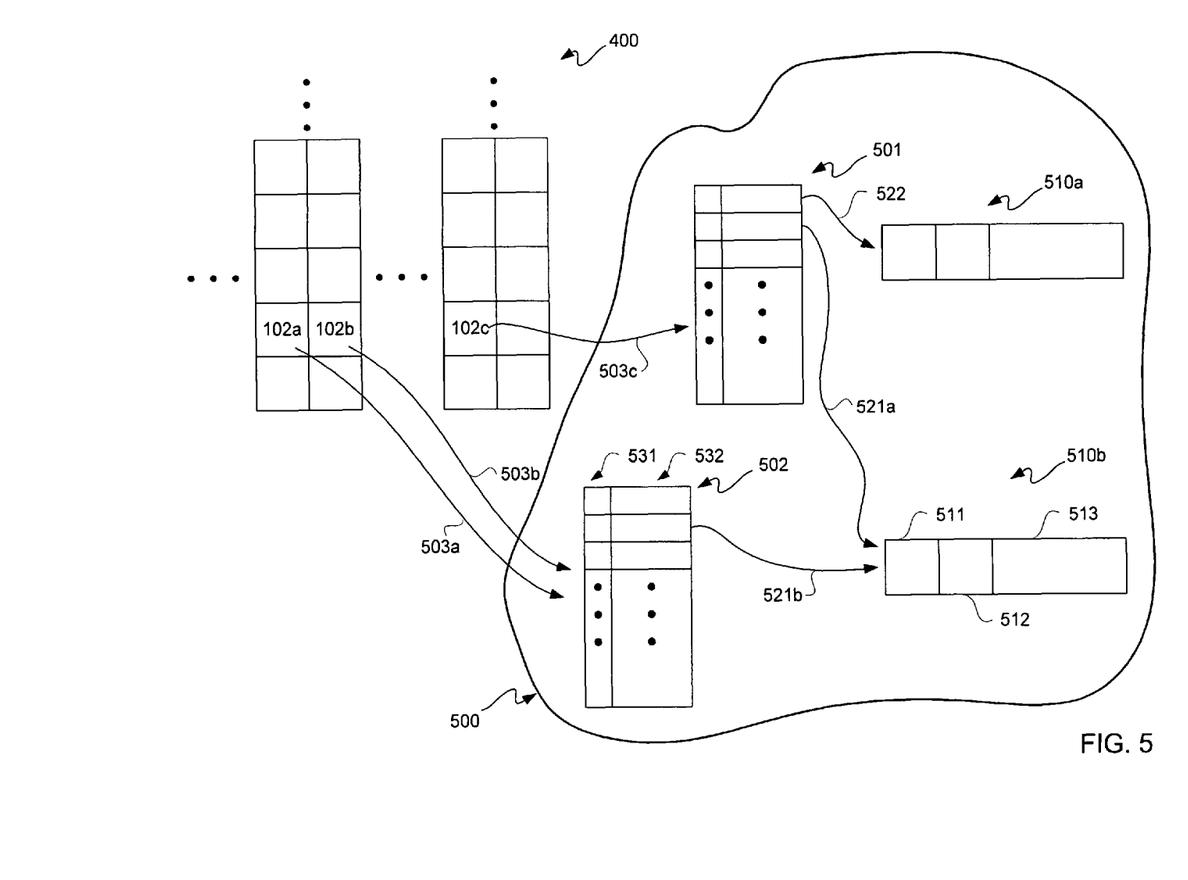
FIG. 5 is block diagram depicting an exemplary embodiment of a multilevel shared database as associated with the array of tiles of FIG. 4.

FIG. 5 is block diagram depicting an exemplary embodiment of a multilevel shared database 500 as associated with array 400 of FIG. 4. CLB 102a has a pointer 503a pointing to a template 502 of database 500. Template 502 may be in the form of a table. CLB 102b has a pointer 503b pointing to template 502 of database 500. In this example, where the longest segmentation is a six-tile wire, both CLBs 102a and 102b have the same routing capability just offset one tile from one another. In other words, the routing capability of CLB 102b is offset one tile in the right horizontal direction from that of CLB 102a. Hence pointers 503a and 503b are the same. Namely, they both point to template 502.

CLB 102c however does not have the exact same routing capability as CLBs 102a and 102b with respect to being able to be described as simply offset one tile. This is because a six-tile wire emanating from CLB 102c would go beyond array 400 in the right horizontal direction as previously described. In other words, a six-tile wire emanating from for CLB 102c will not continue six tiles to the right, as it would for CLBs 102a and 102b. Again, each of CLBs 102a through 102c has the same circuitry, as they are merely repeats of one another, but they do not have the same routing layout.

Accordingly, pointer 503c associated with CLB 102c points to template 501 associated with the routing of that tile. However, not all successor wires of CLB 102c are different from the successor wires of CLBs 102a and 102b. For example, one-tile wires of CLB 102c may have the same routing as one tile wires of CLBs 102a and 102b, other than being offset in the right horizontal direction. Thus for example, if pointer 521a of template 501 and pointer 521b of template 502 were both associated with a one-tile wire, such as one-tile wires 401a and 401c of FIG. 4, then such pointers would point to a same wire template or wire identifier 510b. However, for pointers associated with wires greater in length than one tile, such as pointer 522 of template 501, such pointers would point to a different wire identifier, such as wire identifier 510a, which wire identifier is not found in template 502. In other words, there may be some intersection or sharing among templates, even though such templates are not identical.

Again, in order for a router to find successor wires of a wire w, the router finds a list of successors which w can connect to using a single PIP. Accordingly, template 502 for CLBs 102a and 102b may represent successor wires for wire w emanating from those CLBs. A router may represent nodes of a routing graph, namely the physical wires of an FPGA as integers. The format of the integer representing a wire may be as illustratively depicted with respect to wire identifiers 510a and 510b. Bit positions 511, for example, of wire identifier 510b may be for storing tile row information, such as an x coordinate, and bit positions 512 of wire identifier 510b may be for storing tile column information such as a y coordinate. The higher order bits of wire identifier 510b may be reserved for tile coordinates. The lower order bits in bit positions 513 may be used to store a wire code.

There may be many wires in a switchbox, such as switchbox 301 of FIG. 3, and each of these wires may be given a numerical code. By using numbers rather than names, over all different tile types, memory space may be saved. For example, in a Spartan 3™ FPGA available from Xilinx, Inc., of San Jose, Calif., there are 680 different names of wires, and in a Virtex 5™ FPGA also available from Xilinx, Inc., of San Jose, Calif., there are 2,373 names of wires. It should be appreciated that encoding as densely as possible would provide a maximum wire code that would fit into a very small bit space. However, the set of integers used need not be dense, but may be sparse where unused values are located between used values. It should be appreciated that any format encoding of tile coordinates and wire numbers may be used, provided that tile coordinates and wire numbers are extracted from wire identifiers.

It should be appreciated that tiles of array 400 have respective pointers, namely an array of pointers to tile templates, such as templates 501 and 502, which indicate how source wires find successor wires driven by such tile. In other words, tile template 502 indicates the successor or sink wires of a source wire driven by CLB 102*a* for example. Again, tile templates, such as tile template 502, may be shared among tiles if such tiles have identical tile templates. Accordingly, pointers for CLBs 102*a* and 102*b*, namely pointers 503*a* and 503*b*, respectively point to the same tile template, namely tile template 502, in memory.

Each tile template, such as tile templates 501 and 502, is an array with pointers to wire templates, such as wire templates 510*a* and 510*b*, respectively. Thus, in each tile template there is a pointer to a wire template for each wire code driven by a tile. For example, for a wire code of tile 102*a*, namely a source wire, there is a pointer in tile template 502 to a wire template, such as wire template 510*b*. Along those lines, column 531 of tile template 502 may be a column of wire identifiers, and column 532 of tile template 502 may be a column of coordinates to successor wires. Successor wires may be identified by fixed x and y coordinates or offset x and y coordinates, namely $\Delta x$ and $\Delta y$ coordinates. Alternately, a tile template may be some representation of a sparse array or hash table provided that the tool is capable of obtaining wire templates responsive to target wire numbers. Such wire templates may include flags to indicate if tile coordinates are offset or fixed coordinates. For purposes of clarity by way of example and not limitation, it shall be assumed that offset coordinates are used, even though it will be understood from the following description that fixed coordinates, or a combination of offset and fixed coordinates, may be used.

Figure 6:
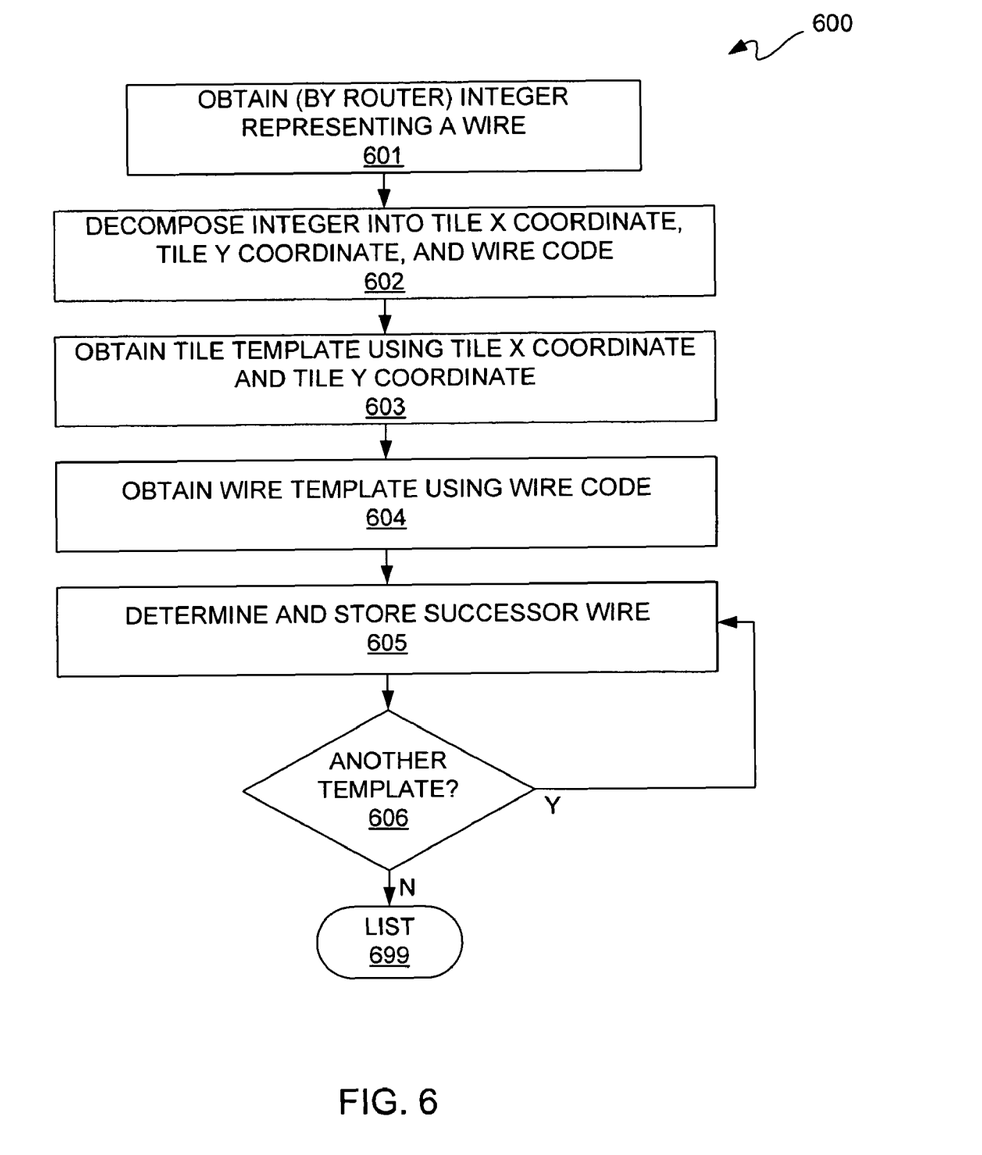
FIG. 6 is a flow diagram depicting an exemplary embodiment of router flow.

FIG. 6 is a flow diagram depicting an exemplary embodiment of router flow 600. At 601, an integer representing a wire is obtained by a router. As previously mentioned, the integer includes x and y coordinate information in the higher bit positions and wire code information in the lower bit positions. However, it should be appreciated that other ways of representing x and y coordinates and wires may be used. However, for purposes of clarity and not limitation, it shall be assumed that the above-described integer representation is used. At 602, the integer obtained at 601 is decomposed into a tile x coordinate, a tile y coordinate, and a wire code.

Figure 7:
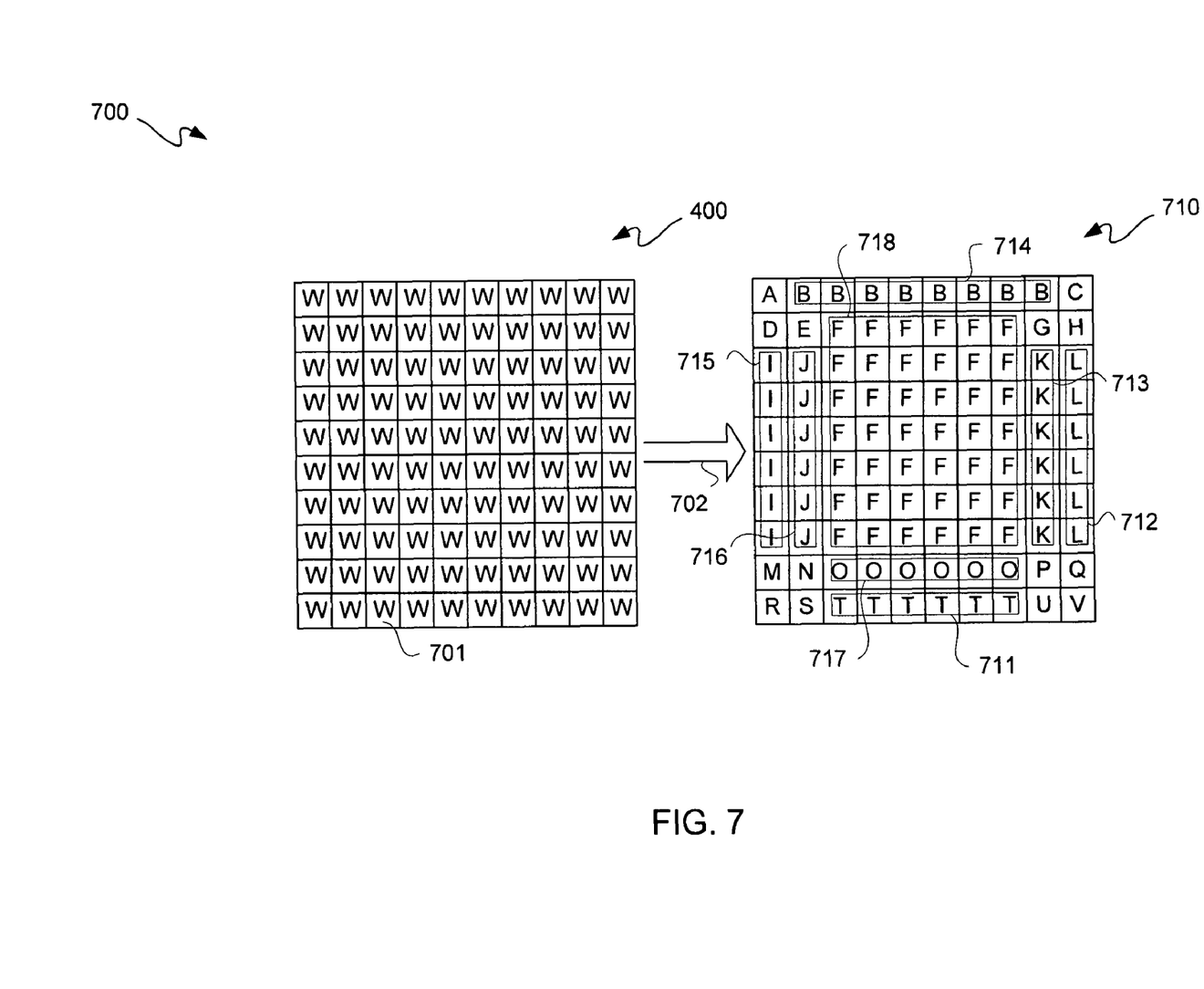
FIG. 7 is a flow diagram depicting an exemplary embodiment of a tile template mapping flow.

At 603, a tile template is obtained using the tile x coordinate and the tile y coordinate identified at 602. Referring to FIG. 7, there is shown a block/flow diagram depicting an exemplary embodiment of a tile template mapping flow 700. An array of tiles 400 has wire information W for each tile 701 replicated. However, as previously described depending on the wire length, the routing for such tiles may be the same or different among tiles. Furthermore, some tiles may share some of their information circuitry with other tiles but not all of their circuitry information with other tiles.

A transformation 702 is used to identify which tiles have same routing information and which tiles have different routing information from other tiles. For purposes of clarity by way of example and not limitation, tile templates of tile template array 710 are described using letters A through V. Each letter of letters A through V represents a different tile template. Accordingly, it should be appreciated that generally centrally located tiles 718 all use tile template F. Tiles 711 through 717 respectively use templates T, L, K, B, I, J, and O. Thus it should be appreciated that the number of templates of tile template array 710 is less than the number of tiles of such array. In other words, template F may be shared among all of tiles 718. There are some tiles, namely corner tiles for example and tiles approximate to such corners that do have same tile templates corresponding to them. However, as previously described, even though a tile may not be the same as another tile, a part of such tile may be the same as the part of another such tile, and those same portions or parts may be shared. Thus for example, even though template A may only be used by the upper left most corner tile of array 710, some of the wire templates used by tile template A may also be used by tile template B, for example wires that extend to the right or down from tiles using these templates in common.

With continuing reference to FIG. 7, it should be understood that a tile template for a tile of array 400 depends on tiles surrounding such tile, as well as the tile itself. In this exemplary embodiment, CLBs 701 of array 400 have interconnect segments of only two lengths, namely lengths one and two. Accordingly, at the edges of array 400, all outgoing doubles and singles, namely interconnect segments of lengths two and one, respectively, are not connected to anything if they extend away from such array.

Thus, the different kinds of tile templates, namely the 22 tile templates A through V, which may be used to describe array 400 are illustratively shown in tile template array 710. It should be appreciated that even though 22 kinds of tile templates are illustratively shown for a ten tile by ten tile array, a larger array may include the same 22 tile templates if such larger array had only interconnect segments of lengths one and two. Furthermore, the additional memory for a larger array may not drastically, but actually only slightly, increase if such array were limited to interconnect segments of lengths one and two. This is because most of the additional increase to such an array would be covered by tile templates F. Additionally, the wire templates used by the tile templates may be shared even between different tile templates, as previously described.

Figure 8:
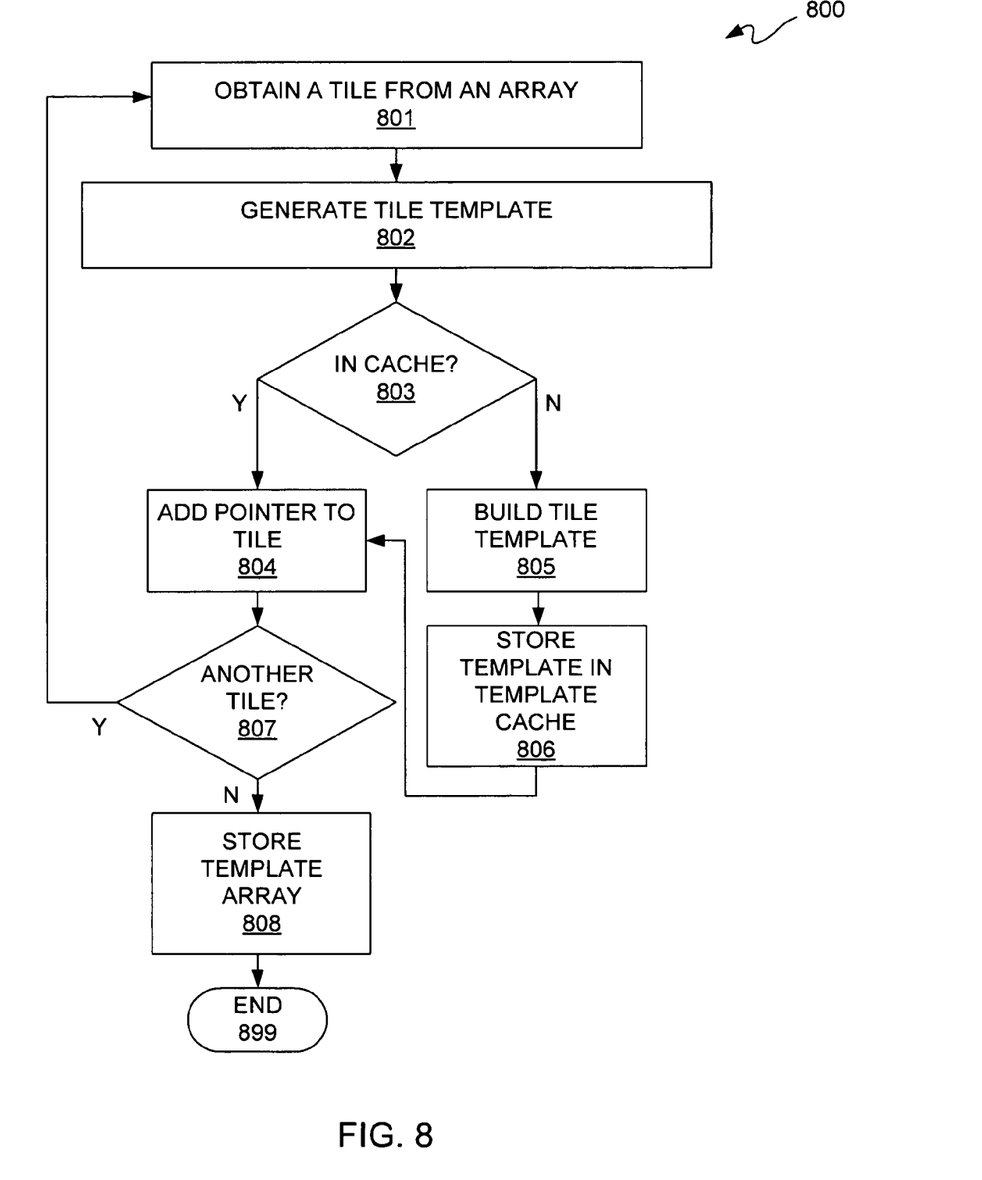
FIG. 8 is flow diagram depicting an exemplary embodiment of a preprocessing flow.

To use a compressed routing graph as described herein, a compilation or preprocessing flow may be used. FIG. 8 is flow diagram depicting an exemplary embodiment of a preprocessing flow 800. During such preprocessing flow 800, each tile may be processed to generate a tile template for it. At 801, a tile is obtained from an array. At 802, a tile template is generated for the tile obtained at 801.

At 803, it is determined if the tile template generated at 802 is already present in a cache of tile templates, such as by wire-to-wire comparison. If such tile template is already in the cache of tile temples, then at 804 a pointer to that already created tile template is put in the tile obtained at 801, namely to effectively make a tile template array, such as tile template array 710 of FIG. 7, an array of pointers.

If, however, it is determined at 803 that such tile template is not already in a tile template cache, then at 805 such tile template is built. In building such tile template, wire templates already existing may be reused, as previously described, due to overlap or sharing with one or more other templates. Once the tile template is built, such tile template may be stored in the tile template cache (memory) at 806, and at 804 a pointer to such tile template may be put in the tile obtained at 801.

At 807, a check for another tile to be processed may be made. If there is another tile to be processed, then flow 800 returns to 801 to obtain another tile. Once all tile templates have been generated for all tiles of array 710, namely once tile template array 710 is completely created, as determined at 807, then such tile template array may be stored at 808 and flow 800 may end at 899. It should be appreciated that the original routing graph may be omitted, as tile template array 710 represents a compressed routing graph. Such compressed routing graph may be stored for loading into a router when such router is executed.

Returning to FIG. 6, a tile template, such as any of templates A through V in the exemplary embodiment of FIG. 7, may thus be obtained according to its tile x and y coordinates. At 604, a wire template is obtained using the wire code decomposed at 602.

Again, because an FPGA, among other integrated circuits, may be tiled in a regular or at least substantially regular manner, an offset template that stores a 3-tuple, namely a $\Delta x$ coordinate, a $\Delta y$ coordinate, and a wire code, may be used. Such offset or wire template obtained at 604 may be used to determine a successor wire at 605. The successor wire determined at 605 may be determined by adding the $\Delta x$ coordinate obtained from the wire template at 604 to the tile x coordinate decomposed at 602, adding the $\Delta y$ coordinate obtained from the wire template at 604 to the tile y coordinate decomposed at 602, and appending the wire code to the integer value obtained. In other words, as previously described the result of the $\Delta x$+tile x coordinate may form the most significant bits of an integer, the result of the $\Delta y$+tile y coordinate may form the next most significant bits of an integer, and the wire code may be appended or concatenated with such bits as the least significant bits. Such successor wire determined may be temporarily stored at 605 for building a list.

The result of such concatenation of bits is in this embodiment an integer, or other wire identification, and such integer may be evaluated at 606 as to whether it is a path end integer, such as a final destination, or not. In other words, at 606 it may be determined if there is another template in the wire template obtained at 604 to process. If at 606 the integer output from 605 is determined not to be a final destination, then another successor wire may be determined and stored at 605. This loop may be repeated until a final destination is found at 606. Once a final destination is found at 606, a list 699 of successor wire may be output for routing.

Accordingly, it should be appreciated that a wire template may be a list of offsets that may be used to compute successor wires from a driver wire. However, rather than a list of offsets, a "for all" template may be used which just stores a wire code. If just a wire code is stored, this may be interpreted that for every possible tile the tile x and tile y coordinates along with the wire code are to be generated for all possible routings for such wire code and successor wires. Furthermore, all possible successor wires may be bounded such as to a portion of array 400 of FIG. 4. Moreover, rather than doing a "for all" template, a "for a subset" template may be used, such as where every other tile within a region has all possible successors wired. Another type of wire template may be an "absolute" template which stores a wire identifier rather than offsets. As previously mentioned, a wire identifier may be absolute or fixed x and y values as well as the wire code. Thus, such a template would list the successor wire directly without having to offset from the source wire. Furthermore, wire templates need not be limited to the examples of an offset template, a "for all" template, a "for subset" template, or an "absolute" template, but may list some other function for determining successor wires. In other words, there may be some other code used to generate successor wires from a current wire. Of course, any such code which is executed in an inner loop of a router should be reasonably efficient so as not to slow down the router too much.

In an alternative embodiment, instead of computing successor wire numbers as previously described, successor wires may be computed just by the wire code and a delta. For example, if the wire code for "E2beg0" is 5 and the code for "E2mid0" is 13, then the wire code for "E2beg0" in the tile at (x=12, y=5) could be 1205005, and the code for "E2mid0" in (x=13, y=5) could be 1305013. In other words, offset from the driver would simply be plus 10008. Thus, the computation of successor wire code by parts and subsequent packing of such parts back together again may be eliminated. Such a single offset form may equally be applied when any part of the offset is negative. For example, getting from (x=21, y=5 Omux5) coded as 2105189, to (x=20, y=4 Omux_sw5), coded as 2004217 would use an offset of −100972. These are merely a couple of numerical examples, and of course other numerical examples may be implemented. However, it should be understood that the determination at 605 of FIG. 6 may be made with just a single offset as opposed to an x offset and a y offset.

Additionally, for timing analysis, software tools may obtain the driver of a wire in order to be able to trace the PIPs used for each distinct fanout of a net. Accordingly, additional offset values may be added to the tile template. Such additional offset values may be for input wires on a tile to directly locate a driver of a wire. This may be useful for high fanout nets, namely nets with significantly high fanouts such as those associated with clock signals, which may reduce sharing because the tile offset would be so different. For such nets, a separate map may be used where such separate map would correspond to the inverse of the "for all" wire template.

Figure 9:
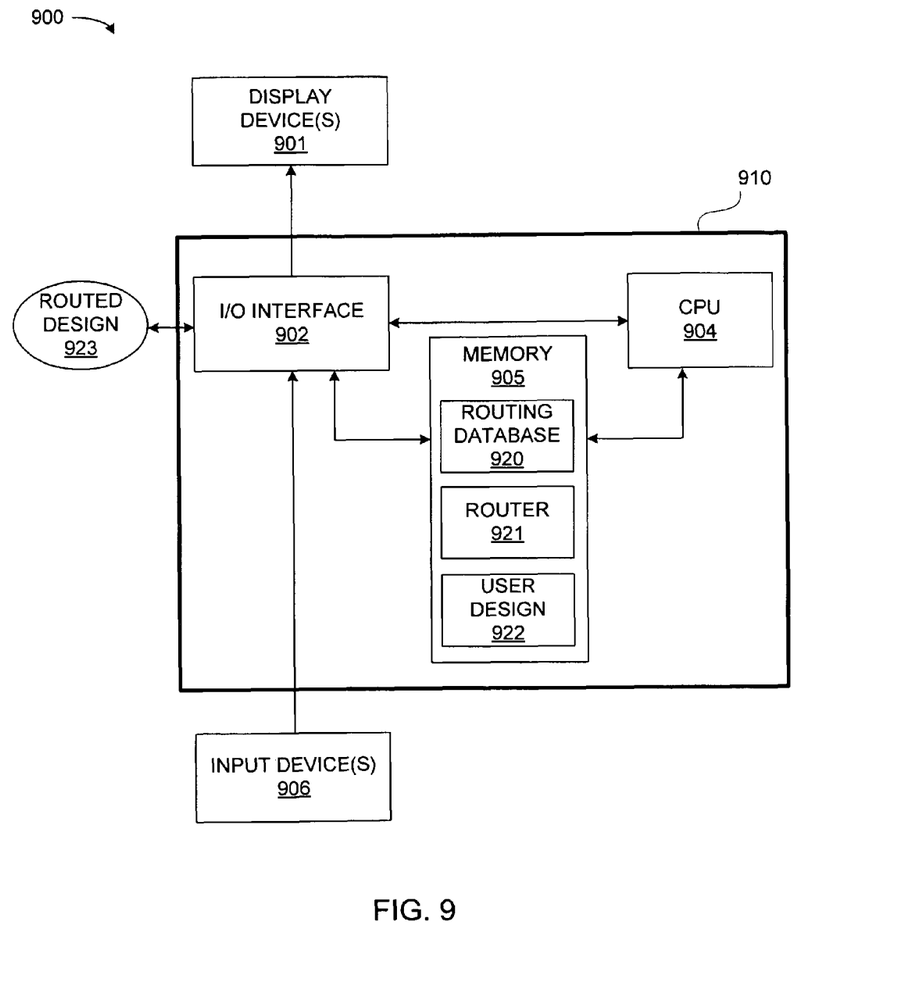
FIG. 9 is a high-level block diagram of an exemplary embodiment of a computer system.

FIG. 9 is a high-level block diagram of an exemplary embodiment of a computer system 900. Computer system 900 may include a programmed computer 910 coupled to one or more display devices 901, such as Cathode Ray Tube ("CRT") displays, Plasma displays, Liquid Crystal Displays ("LCD"), and to one or more input devices 906, such as a keyboard and a cursor pointing device. Other known configurations of a computer system may be used.

Programmed computer 910 may be programmed with a known operating system, which may be Mac OS, Java Virtual Machine, Linux, Solaris, Unix, or a Windows operating system, among other known platforms. Programmed computer 901 includes a central processing unit (CPU) 904, memory 905, and an input/output ("I/O") interface 902. CPU 904 may be a type of microprocessor known in the art, such as available from IBM, Intel, and Advanced Micro Devices for example. Support circuits (not shown) may include conventional cache, power supplies, clock circuits, data registers, and the like. Memory 905 may be directly coupled to CPU 904 or coupled through I/O interface 902. At least a portion of an operating system may be disposed in memory 905. Memory 905 may include one or more of the following: random access memory, read only memory, magneto-resistive read/write memory, optical read/write memory, cache memory, magnetic read/write memory, and the like, as well as signal-bearing media as described below.

I/O interface 902 may include chip set chips, graphics processors, and daughter cards, among other known circuits. An example of a daughter card may include a network interface card ("NIC"), a display interface card, a modem card, and a Universal Serial Bus ("USB") interface card, among other known circuits. Thus, I/O interface 902 may be coupled to a conventional keyboard, network, mouse, display printer, and interface circuitry adapted to receive and transmit data, such as data files and the like. Notably, programmed computer 910 may be coupled to a number of client computers, server computers, or any combination thereof via a conventional network infrastructure, such as a company's Intranet and/or the Internet, for example, allowing distributed use for interface generation.

Memory 905 may store all or portions of one or more programs, such as a router 921, as well as data in a database, such as a routing database 920 as described herein, to implement processes in accordance with one or more aspects of the invention. Thus, router 921 may access data in tile templates and wire templates stored in routing database 920 for output of a wire route. Such routing information in routing database 920 may be used for routing a user design 922, which may be stored in memory 905. Thus, a user design 922 may be routed using routing data in routing database 920 to output a routed design 923 of user design 922 for instantiation in programmable logic associated with tiles of a programmable logic device, such as FPGA 100 of FIG. 1. Additionally, those skilled in the art will appreciate that one or more aspects of the invention may be implemented in hardware, software, or a combination of hardware and software. Such implementations may include a number of processors independently executing various programs and dedicated hardware or programmable hardware.

One or more database(s) of the program product, as well as documents thereof, may define functions of embodiments in accordance with one or more aspects of the invention and can be contained on a variety of signal-bearing media, such as computer-readable media having code, which include, but are not limited to: (i) information permanently stored on non-writable storage media (e.g., read-only memory devices within a computer such as CD-ROM or DVD-ROM disks readable by a CD-ROM drive or a DVD drive); (ii) alterable information stored on writable storage media (e.g., floppy disks within a diskette drive or hard-disk drive or read/writable CD or read/writable DVD); or (iii) information conveyed to a computer by a communications medium, such as through a computer or telephone network, including wireless communications. The latter embodiment specifically includes information downloaded from the Internet and other networks. Furthermore, such signal-bearing media may be in the form of a carrier wave or other signal propagation medium via a communication link for streaming information, including downloading all or a portion of a computer program product. Such signal-bearing media, when carrying computer-readable instructions that direct functions of one or more aspects of the invention, represent embodiments of the invention.

Accordingly, it should be understood that a multilevel cache edge-graph representation has been described depending on the number of segmentations, for example, if there are only two segmentations, then a two level cache edge graph representation may be used. If however, there are more than two levels of segmentation, then a more than two level cache edge-graph representation may be implemented.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A system for routing an integrated circuit, comprising:
a database storing wire templates and tile templates that define routing edges, the routing edges being associated with a plurality of wire length segmentations; and
a processor configured to:
associate the tile templates with tiles of an integrated circuit, the tiles being repeated circuit blocks forming an array, a portion of the tile templates being shared among a portion of the tiles such that the tile templates are less in number than the tiles, and
associate the tile templates with pointers for pointing to the wire templates.

2. The system according to claim 1, wherein the processor is configured to associate the tile templates with the pointers such that a portion of the wire templates are shared among the portion of the tile templates.

3. The system according to claim 2, wherein the wire templates have row coordinate information, column coordinate information, and wire code information; and
wherein the row coordinate information and the column coordinate information is for the array.

4. The system according to claim 3, wherein the row coordinate information and the column coordinate information are associated with row offset information and column offset information, respectively.

5. The system according to claim 3, wherein the row coordinate information and the column coordinate information are associated with row locations and a column locations, respectively.

6. The system according to claim 3, wherein each of the tile templates has a column of wire identifiers and a column of coordinates to successor wires.

7. A non-transitory machine-readable medium having stored thereon information representing instructions that, when executed by a processor, cause the processor to perform routing operations comprising:
accessing a database of tile templates and wire templates by a router for routing a user design;
the database including:
routing edges defined by the tile templates;
the routing edges being associated with a plurality of wire length segmentations;
the tile templates being associated with tiles of an integrated circuit;
the tiles being repeated circuit blocks forming an array;
a portion of the tile templates being shared among a portion of the tiles such that the tile templates are less in number than the tiles; and
the tile templates being associated with pointers for pointing to the wire templates; and
routing the user design using data in the database and the user design to output a routed circuit for instantiation in programmable logic associated with the tiles.

8. A method for providing routing information for an integrated circuit, comprising:
obtaining a tile template that defines a routing edge, the routing edge being associated with one or more wire length segmentations;
associating, using a processor, the tile template with tiles of an integrated circuit, the tiles being repeated circuit blocks forming an array, wherein the act of associating the tile template with the tiles of the integrated circuit involves sharing the tile template among the tiles such that the tile template is less in number than the tiles;
obtaining a wire template; and
associating the tile template with a pointer for pointing to the wire template.

9. The method of claim 8, further comprising:
obtaining a wire representation;
decomposing the wire representation into position information and wire information, wherein the tile template is obtained responsive to the position information, and the wire template is obtained responsive to the wire information, the wire template including location information and being associated with wires of one of the tiles; and using the position information and the location information for determining a successor wire.

10. The method according to claim 9, wherein the successor wire is determined by adding offset information from the location information to coordinate information from the position information.

11. The method according to claim 10, wherein the position information includes a row address and a column address; and
wherein the row address is added to an x-direction offset of the offset information and the column address is added to a y-direction offset of the offset information to respectively provide a x coordinate and a y coordinate.

12. The method according to claim 11, wherein the successor wire is determined by:
concatenating bits of the x coordinate with bits of the y coordinate to obtain an integer value;
appending bits of the wire information to the integer value to provide a wire identification; and
ascertaining whether the wire identification represents the successor wire or a path end.

13. The method according to claim 9, wherein the wire template is a list of coordinate offsets for determining successor wires, including the successor wire, from a source wire.

14. The method according to claim 9, wherein the wire template is a list of fixed x and y coordinates for determining successor wires, including the successor wire, from a source wire.

15. The method according to claim 9, further comprising:
obtaining a wire code and a delta offset from the wire template; and
generating position of the successor wire using the delta offset along with the wire code.

16. The method according to claim 9, wherein the wire representation is for a source wire.

17. The method according to claim 9, wherein the wire representation is for a sink wire.

18. The method according to claim 8, wherein:
the act of obtaining the tile template comprises obtaining a set of tile templates that include the tile template,
the integrated circuit comprises a set of tiles that include the tiles, and
a number of all of the tile templates in the set of tile templates is less in number than all of the tiles in the set of tiles.

19. The method according to claim 8, further comprising:
obtaining a wire code from the wire template; and
generating x and y coordinates along with the wire code for all possible routings for the wire code and successor wires thereof for all tiles in at least a portion of the array of the circuit blocks.

20. The method according to claim 8, further comprising:
obtaining a wire code from the wire template; and
generating x and y coordinates along with the wire code for all possible routings for the wire code and successor wires thereof for a subset of all tiles in at least a portion of the array of circuit blocks.

* * * * *